United States Patent
Li et al.

(10) Patent No.: US 11,287,462 B2
(45) Date of Patent: Mar. 29, 2022

(54) STATUS DETECTION OF ALARM SOUNDING PARTS

(71) Applicant: Carrier Corporation, Palm Beach Gardens, FL (US)

(72) Inventors: Zhijun Li, Hebei (CN); Zhihao Zhou, Hebei (CN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 16/926,198

(22) Filed: Jul. 10, 2020

(65) Prior Publication Data
US 2021/0018551 A1 Jan. 21, 2021

(30) Foreign Application Priority Data
Jul. 19, 2019 (CN) .......................... 201910654680.1

(51) Int. Cl.
| | |
|---|---|
| *G01R 31/11* | (2006.01) |
| *G01R 31/64* | (2020.01) |
| *G08B 29/06* | (2006.01) |
| *G08B 17/06* | (2006.01) |
| *G10K 9/122* | (2006.01) |

(52) U.S. Cl.
CPC .............. *G01R 31/11* (2013.01); *G01R 31/64* (2020.01); *G08B 17/06* (2013.01); *G08B 29/06* (2013.01); *G10K 9/122* (2013.01)

(58) Field of Classification Search
CPC ........ G01R 31/11; G01R 31/64; G08B 17/06; G08B 29/06; G10K 9/122
See application file for complete search history.

(56) References Cited

U.S. PATENT DOCUMENTS

| | | | |
|---|---|---|---|
| 3,665,461 A | 5/1972 | Gnagi et al. | |
| 4,290,057 A | 9/1981 | Knight | |
| 5,111,042 A * | 5/1992 | Sullivan | H05H 3/02 250/251 |
| 7,372,369 B2 | 5/2008 | Larkin | |
| 7,400,227 B2 | 7/2008 | Becker et al. | |
| 7,609,154 B2 | 10/2009 | Bennett | |

(Continued)

FOREIGN PATENT DOCUMENTS

| | | |
|---|---|---|
| CN | 102130436 A | 7/2011 |
| CN | 202230589 U | 5/2012 |

(Continued)

*Primary Examiner* — Mohamed Barakat
(74) *Attorney, Agent, or Firm* — Cantor Colburn LLP

(57) ABSTRACT

The invention belongs to the technical field of alarm sounding component, and relates to state detection of an alarm sounding component. The invention provides a state detection device of an alarm sounding component, comprising: a detection circuit for applying a detection signal to control detection of an equivalent load capacitor of the alarm sounding component that is capacitive; a sampling circuit for sampling feedback information of the equivalent load capacitor of the alarm sounding component when a signal of the detection signal is applied to the alarm sounding component to obtain a sampled signal; and a controller for generating the detection signal, and analyzing and processing the sampled signal to obtain state information which can reflect a fault condition of the alarm sounding component.

13 Claims, 3 Drawing Sheets

(56) References Cited

U.S. PATENT DOCUMENTS

| | | | | |
|---|---|---|---|---|
| 7,911,353 B2* | 3/2011 | Bedingfield | ............ | A61M 1/14 |
| | | | | 340/660 |
| 8,887,552 B2 | 11/2014 | Madsen et al. | | |
| 10,074,988 B2* | 9/2018 | Oates | .................... | H02M 7/483 |
| 2013/0070933 A1* | 3/2013 | Itou | ........................ | H04R 3/007 |
| | | | | 381/59 |
| 2015/0055786 A1* | 2/2015 | Barson | ................... | H04R 17/00 |
| | | | | 381/59 |
| 2019/0052190 A1* | 2/2019 | Sodo | ................... | G01R 31/083 |

FOREIGN PATENT DOCUMENTS

| | | |
|---|---|---|
| CN | 203204103 U | 9/2013 |
| CN | 104732741 A | 6/2015 |
| CN | 208015445 U | 10/2018 |
| CN | 109031010 A | 12/2018 |
| EP | 2916303 A1 | 9/2015 |
| KR | 101867562 B1 | 7/2018 |
| KR | 101984624 B1 | 5/2019 |
| RU | 2024946 C1 | 12/1994 |

\* cited by examiner

STATUS DETECTION OF ALARM SOUNDING PARTS

FOREIGN PRIORITY

This application claims priority to Chinese patent application No. 201910654680.1, filed Jul. 19, 2019, and all the benefits accruing therefrom under 35 U.S.C. § 119, the contents of which in its entirety are herein incorporated by reference

FIELD OF THE INVENTION

The invention belongs to the technical field of alarm sounding component, and relates to a state detection device of an alarm sounding component, a field alarm terminal using the state detection device, and a fire alarm system.

BACKGROUND OF THE INVENTION

An alarm sounding component (such as a buzzer) is triggered, for example, in certain emergency situations to raise an audio alarm signal, and thus, the alarm sounding component is an important critical terminal component.

However, alarm sounding component such as the buzzer, and the like, is prone to fault conditions (open circuit, short circuit, etc.) due to various reasons (e.g., short circuit of pad welding, long service time), and it is difficult to guarantee the reliability of work for a long time.

SUMMARY OF THE INVENTION

It is one object of the present invention to realize accurate detection of a fault of an alarm sounding component.

It is another object of the present invention to detect the fault condition of the alarm sounding component quickly and timely.

It is yet another object of the present invention to improve the reliability of a fire alarm system.

To realize the foregoing objects or other objects, the invention provides the following technical solution.

According to a first aspect of the present invention, there is provided a state detection device of an alarm sounding component, comprising:

a detection circuit for applying a detection signal to control detection of an equivalent load capacitor of the alarm sounding component that is capacitive;

a sampling circuit for sampling feedback information of the equivalent load capacitor of the alarm sounding component when a signal of the detection signal is applied to the alarm sounding component to obtain a sampled signal; and a controller for generating the detection signal and analyzing and processing the sampled signal to obtain state information which can reflect a fault condition of the alarm sounding component.

The state detection device according to an embodiment of the invention, wherein the alarm sounding component is used for a field alarm terminal of a fire alarm system.

The state detection device according to another embodiment or any of the above embodiments of the invention, wherein the alarm sounding component is a piezoelectric buzzer.

The state detection device according to another embodiment or any of the above embodiments of the invention, wherein the detection signal is a pulse voltage signal.

The state detection device according to another embodiment or any of the above embodiments of the invention, wherein a frequency of the pulse voltage signal is in a range of an order of 10 KHz to 1 MHz.

The state detection device according to another embodiment or any of the above embodiments of the invention, wherein the detection circuit comprises:

a triode, a base of the triode is biased with the pulse voltage signal to control on and off of the triode, and a collector of the triode is electrically connected with a first end of the alarm sounding component, and an emitter of the triode is grounded; and a low-voltage power supply for outputting direct current voltage to a second end of the alarm sounding component.

The state detection device according to another embodiment or any of the above embodiments of the invention, wherein the sampling circuit comprises: an inductor, two ends of the inductor are electrically connected with the first end and the second end of the alarm sounding component respectively so as to be in parallel connection with the equivalent load capacitor; and a first sampling resistor and a second sampling resistor disposed in series with the inductor; wherein the first sampling resistor is disposed between the inductor and the low-voltage power supply, and the second sampling resistor is disposed between the inductor and the controller.

The state detection device according to another embodiment or any of the above embodiments of the invention, wherein the controller comprises: a sampled signal processing module for analyzing and processing the sampled signal to obtain state information which can reflect the fault condition of the alarm sounding component; a detection signal generation module for generating the detection signal; and a state information output module for controlling the output of the state information.

The state detection device according to another embodiment or any of the above embodiments of the invention, wherein the detection signal is a pulse voltage signal; the sampled signal processing module is further used for calculating a voltage mean value of the sampled signal during a time period correspondingly including the occurrence of the falling edge of the pulse voltage signal, and performing analog-to-digital conversion on the voltage mean value to obtain first digital state information.

The state detection device according to another embodiment or any of the above embodiments of the invention, wherein the state information output module is further used to amplify and convert the first digital state information into second digital state information section by section.

The state detection device according to another embodiment or any of the above embodiments of the invention, wherein the state information comprises: normal state information reflecting that the alarm sounding component works normally, open circuit state information reflecting that the alarm sounding component is open circuited, and short circuit state information reflecting that the alarm sounding component is short circuited.

According to a second aspect of the present invention, there is provided a field alarm terminal, comprising: an alarm sounding component for raising an audio alarm signal, and a state detection device of any of the above embodiments.

According to a third aspect of the present invention, there is provided a fire alarm system, comprising: one or more field alarm terminals of any of the above embodiments; and a control module coupled with the field alarm terminal and receiving state information from the field alarm terminal.

The fire alarm system according to an embodiment of the invention, wherein the control module comprises: a fault prompt unit for prompting a fault condition of respective field alarm terminal based on the state information.

The fire alarm system according to another embodiment or any of the above embodiments of the present invention, wherein the control module comprises: state confirmation module for confirming the fault condition of the alarm sounding component of the respective field alarm terminal based on the state information.

The above features and operations of the present invention will become more fully apparent from the following description and the accompanying drawings.

BRIEF DESCRIPTION OF THE DRAWINGS

The above and other objects and advantages of the present invention will become more complete and clear from the following detailed description taken in conjunction with the accompanying drawings, in which like or similar elements are designated by like numerals.

DETAILED DESCRIPTION OF THE EMBODIMENT(S) OF THE INVENTION

For the purpose of brevity and illustration, the principles of the invention are described herein primarily with reference to exemplary embodiments thereof. However, those skilled in the art will readily recognize that the same principles are equally applicable to all types of state detection devices and that these same principles may be implemented therein, and that any such variations do not depart from the true spirit and scope of the present patent application. Moreover, in the following description, reference is made to the accompanying drawings, which illustrate specific exemplary embodiments. Electrical, mechanical, logical, and structural changes may be made to these embodiments without departing from the spirit and scope of the present invention. Further, although features of the invention are disclosed in conjunction with several embodiments/only one of the embodiments, such features may be combined with other embodiments/one or more other features of embodiments, as may be desirable and/or advantageous for any given or identifiable function. The following description is, therefore, not to be taken in a limiting sense, and the scope of the present invention is defined by the appended claims and their equivalents.

The terms "first", "second", and the like, where used, do not necessarily denote any order or priority relationship, but rather may be used to distinguish one element or time interval from another more clearly.

Figure 1:
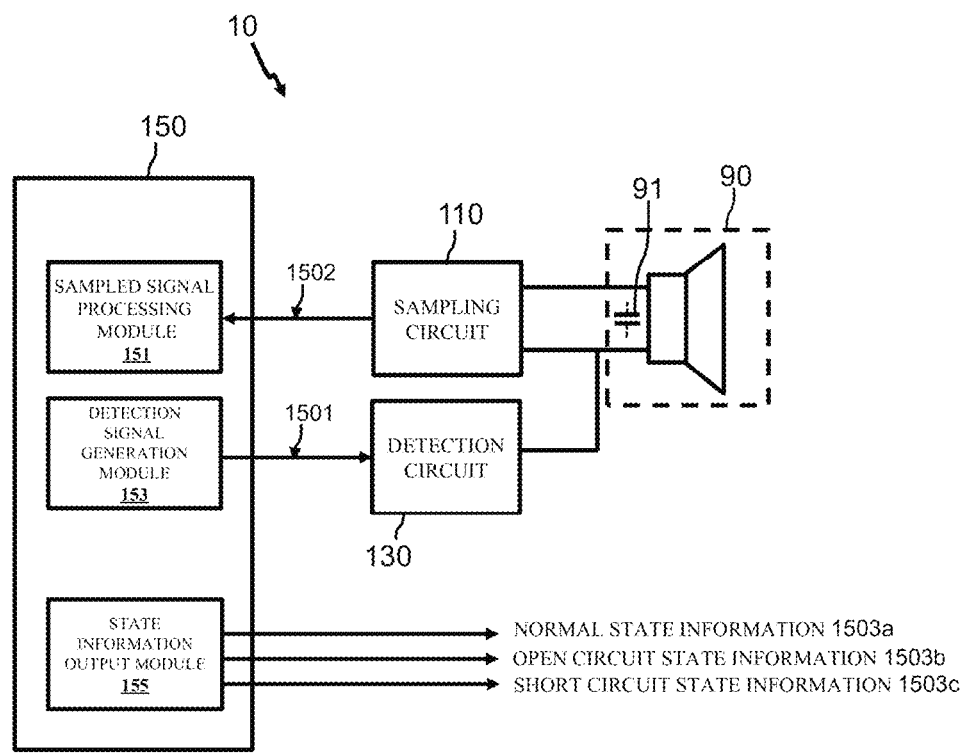
FIG. 1 is a schematic diagram of the module structure of a state detection device of an alarm sounding component according to an embodiment of the invention.
Figure 2:
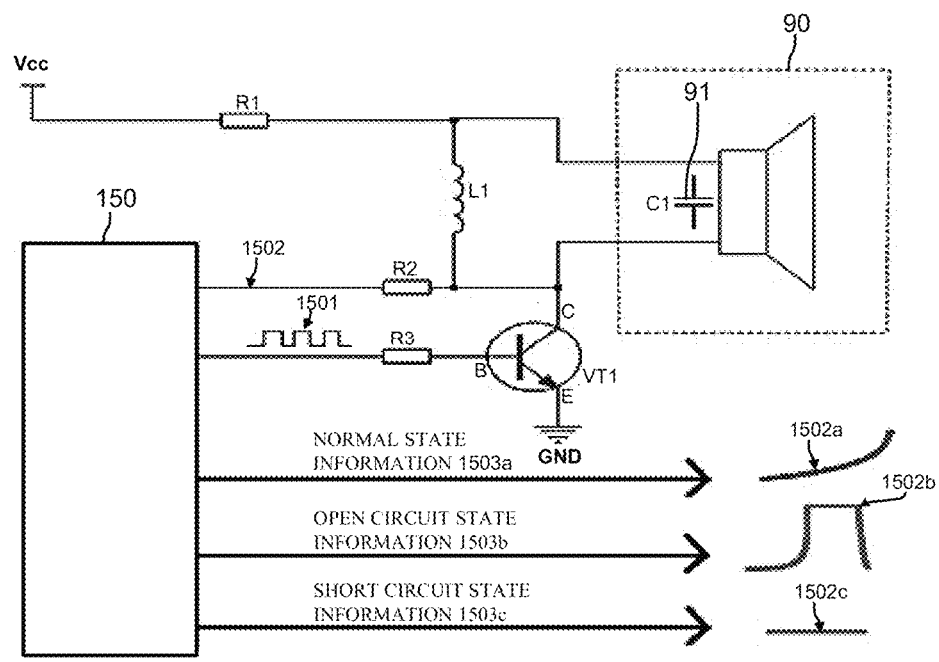
FIG. 2 is a schematic diagram of an exemplary circuit structure of the state detection device shown in FIG. 1.

FIG. 1 is a schematic diagram of the module structure of a state detection device of an alarm sounding component according to an embodiment of the invention. As shown in FIG. 1, the alarm sounding component 90 that is detected or monitored can be triggered to work under control of a respective control component to raise an audio alarm signal, and specifically, the alarm sounding component 90 can be driven to work based on known working principles. The alarm sounding component 90 may be a capacitive sounding component, i.e. it has an equivalent capacitive load, such as the equivalent load capacitor C1 as shown in FIG. 2, whose specific amplitude is related to the own characteristic, model, etc., of the alarm sounding component 90 itself, for example, the amplitude of the capacitor C1 is on the order of nF. In an embodiment, the capacitive sounding component may be a piezoelectric buzzer.

Figure 5:
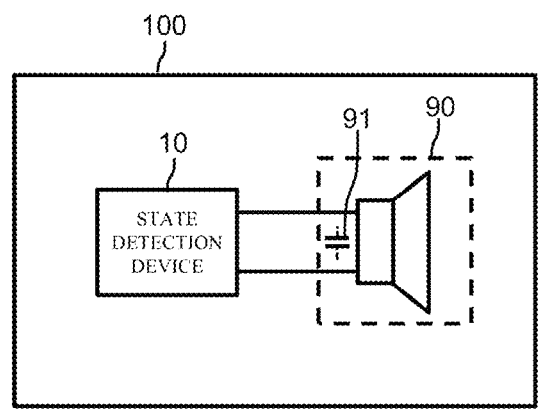
FIG. 5 is a schematic diagram of the module structure of a field alarm terminal according to an embodiment of the present invention.

As shown in FIG. 1, the state detection device 10 may be integrally disposed with the alarm sounding component 90, e.g., integrated together to form a field alarm terminal 100 as in the embodiment shown in FIG. 5. The state detection device 10 includes a controller 150 disposed corresponding to the alarm sounding component 90, which may be implemented by one or more of a single chip microcomputer, a microcontroller, an integrated circuit, a programmable controller, etc., and in an specific embodiment, the controller 150 may be shared with a controller for driving the alarm sounding component 90 to work, reducing, for example, the cost of the field alarm terminal 100.

The controller 150 may generate a detection signal 1501 while receiving a sampled signal 1502 collected by the detection process, and output respective state information 1503 that can reflect the fault condition of the alarm sounding component 90 (e.g., the normal state information 1503a reflecting the alarm sounding component 90 working normally, the open circuit state information 1503b reflecting the alarm sounding component 90 being open circuited, and the short circuit state information 1503c reflecting the alarm sounding component 90 being short circuited) based on the sampled signal 1502, and the representation forms of the specific information of these state information 1503 are not limited to the following examples.

In an embodiment, the controller 150 is configured with a detection signal generation module 153 for generating a detection signal 1501; the detection signal 1501 may specifically be a pulse voltage signal, such as a high frequency pulse signal. The selection of the frequency of the pulse voltage signal is influenced by factors such as the magnitude of the capacitance of the equivalent load capacitor C1, and the like, and specifically, the frequency of the pulse voltage signal is selected within the range of the order of 10 KHz to 1 MHz, for example, 500 KHz.

In an embodiment, the controller 150 is further configured to analyze and process the sampled signal 1502 received by the controller 150 to obtain state information 1503, specifically, as shown in FIG. 1, the controller 150 is further configured with a sampled signal processing module 151 and a state information output module 155, which are illustrated exemplarily below in conjunction with the sampling circuit 110.

Continuing as shown in FIG. 1, the state detection device 10 further includes a detection circuit 130 disposed corresponding to the alarm sounding component 90 for applying the detection signal 1501 to control the detection of the capacitive alarm sounding component 90, i.e., the detection of the equivalent load capacitor C1 thereof. It will be understood that the detection signal 1501 may be applied continuously so as to monitor the fault condition of the alarm sounding component 90 continuously.

Continuing as shown in FIG. 1, the state detection device 10 further includes a sampling circuit 110 disposed correspondingly to the alarm sounding component 90 for sampling the feedback information of the equivalent load capacitor C1 of the alarm sounding component 90 when the equivalent load capacitor C1 is applied to the signal of the detection signal 1501 to obtain the sampled signal 1502. The sampled signal 1502 is input to the controller 150 through a certain pin.

The specific structure of the sampling circuit 110 and the detection circuit 130 is illustrated exemplarily below in conjunction with FIGS. 2 to 4.

Figure 3:
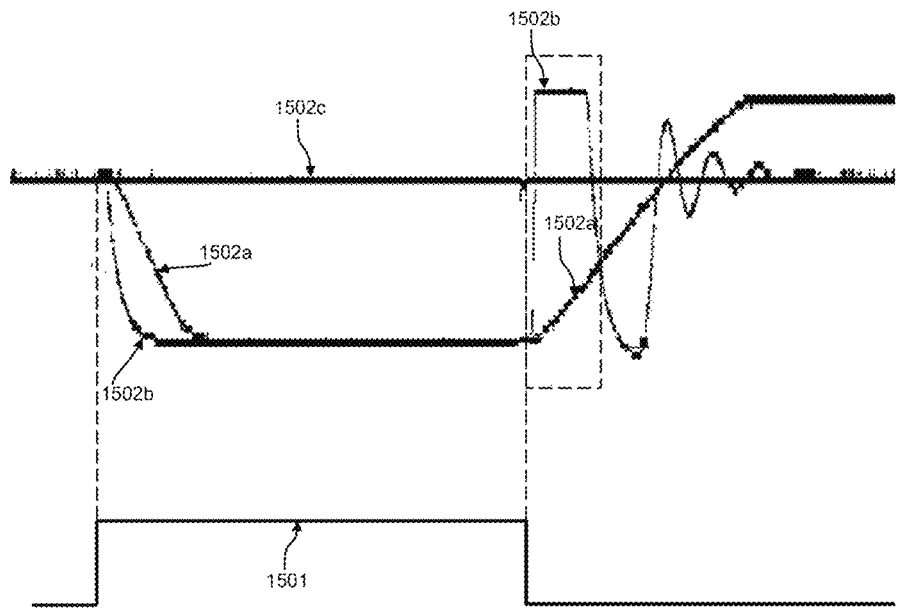
FIG. 3 is a feedback waveform diagram of the alarm sounding component when the detection signal is applied to the state detection device shown in FIG. 2.

FIG. 2 is a schematic diagram of an exemplary circuit structure of the state detection device shown in FIG. 1, and FIG. 3 is a feedback waveform diagram of the alarm sounding component when the detection signal is applied to the state detection device shown in FIG. 2, i.e., being the same as or similar to the waveform of the sampled signal 1502 detected correspondingly by the sampling circuit 110, and meanwhile the detection signal 1501 is shown in FIG. 3 for ease of understanding.

As shown in FIG. 2, the detection circuit 130 may include a triode VT1 and a low-voltage power supply for providing a DC voltage Vcc output. Wherein, the base B of the triode VT1 is electrically connected with the detection signal output end of the controller 150 through the resistor R3, so that the base B is biased with the pulse voltage signal as the detection signal 1501, and the triode VT1 is controlled to be on and off by the pulse voltage signal (e.g., to be on under high level and to be off under low level); the collector C of the triode VT1 is electrically connected with the first end of the alarm sounding component 90, and the emitter E of the triode VT1 can be grounded. Wherein, the low-voltage power supply is used for outputting the DC voltage Vcc to a second end of the alarm sounding component 90. Thus, when the pulse voltage signal is high level, the triode VT1 is on, and the equivalent load capacitor C1 of the alarm sounding component 90 can be charged.

Continuing as shown in FIG. 2, the sampling circuit 110 includes an inductor L1 and corresponding sampling circuits R1 and R2. Wherein, the two ends of the inductor L1 are electrically connected with the first end and the second end of the alarm sounding component 90 respectively, so that the inductor L1 is connected with the equivalent load capacitor C1 in parallel; wherein the first sampling resistor R1 and the second sampling resistor R2 are disposed in series with the inductor L1, the first sampling resistor R1 is disposed between the inductor L1 and the low-voltage power supply Vcc, and the second sampling resistor R2 is disposed between the inductor L1 and the controller 150.

Based on the above exemplary detection circuit and sampling circuit and detection signal 1501, corresponding to different states (normal, open circuited, or short circuited) of the capacitor C1, sampled waveform information, i.e., sampled signals 1502a, 1502b, and 1502c, as shown in FIG. 3 may be collected. Wherein, with a sampled signal 1502a sent, if capacitor C1 is normal, then at the time corresponding to the occurrence of the falling edge of the detection signal 1501, the triode VT1 is off and capacitor C1 will be discharged through inductor L1, so that the level of the sampled signal 1502a increases relatively slowly during the time period corresponding to the dashed box in FIG. 3; with a sampled signal 1502b sent, if capacitor C1 is open circuited, then at the time corresponding to the occurrence of the falling edge of the detection signal 1501, the triode VT1 is off, capacitor C1 does not have the capacitive discharge process described above, electrical signals through the circuits of R1, L1, and R2 are collected, so that the level of the sampled signal 1502b increases relatively fast and then decreases fast during the time period corresponding to the dashed box in FIG. 3; with a sampled signal 1502c sent, if capacitor C1 is short circuited, then at the time corresponding to the occurrence of the falling edge of the detection signal 1501, the triode VT1 is off, the capacitor C1 does not have the capacitive discharge process described above and the inductor L1 is short circuited, electrical signals through the circuits of R1 and R2 are collected, so that the level of the sampled signal 1502c remains unchanged during the time period corresponding to the dashed box in FIG. 3, the magnitude of the level depends on the resistance of the first sampling resistor R1 and the second sampling resistor R2.

It can be seen that, during the time period indicated by the dashed box in FIG. 3, which correspondingly includes the occurrence of the falling edge of the pulse voltage signal, a corresponding analog collected signal 1502 is actually sufficient to distinguish the state information of the alarm sounding component 90. It is to be understood that the time period of the dashed box can be determined in advance, e.g., according to the length of the time period in which the level of the sampled signal 1502b increases relatively fast and then decreases fast, also, during the collection process, the collection can be performed based on the timing of the detection signal 1501.

As shown in connection with FIG. 1, the sampled signal processing module 151 is configured to analyze and process the sampled signal 1502 to obtain state information 1503 that can reflect the fault condition of the alarm sounding component 90, for example, by analyzing and processing the sampled signal 1502a or 1502b or 1502c of the time period corresponding to, for example, the dashed box as determined above, state information 1503 reflecting the fault condition of the alarm sounding component 90 may be obtained. In an embodiment, the sampled signal processing module 151 is configured with an analog to digital converter, and the sampled signal processing module 151 first calculates a voltage mean value of the sampled signal 1502 during the time period correspondingly including the occurrence of the falling edge of the pulse voltage signal, and then performs an analog-to-digital conversion on the analog voltage mean value to obtain first digital state information.

Further, the state information output module 155 in the controller 150 is further configured to amplify and convert the first digital state information into second digital state information (i.e., the outputted state information 1503) section by section, such that the outputted state information 1503 controlled by the state information output module 155 will be sufficient to be differentiated clearly, so that the influence on the accuracy of the state detection due to factors such as waveform oscillation of the sampled signal 1502 (e.g., caused by voltage fluctuations thereof) is small, and the like, effectively improving the accuracy of the state detection.

It should be noted that the circuit structure of the embodiment shown in FIG. 2 above is relatively simple and low in cost of implementation. It will be appreciated that the triode VT1 may be implemented by other controllable switching components that enable the same or similar functions.

Figure 4:
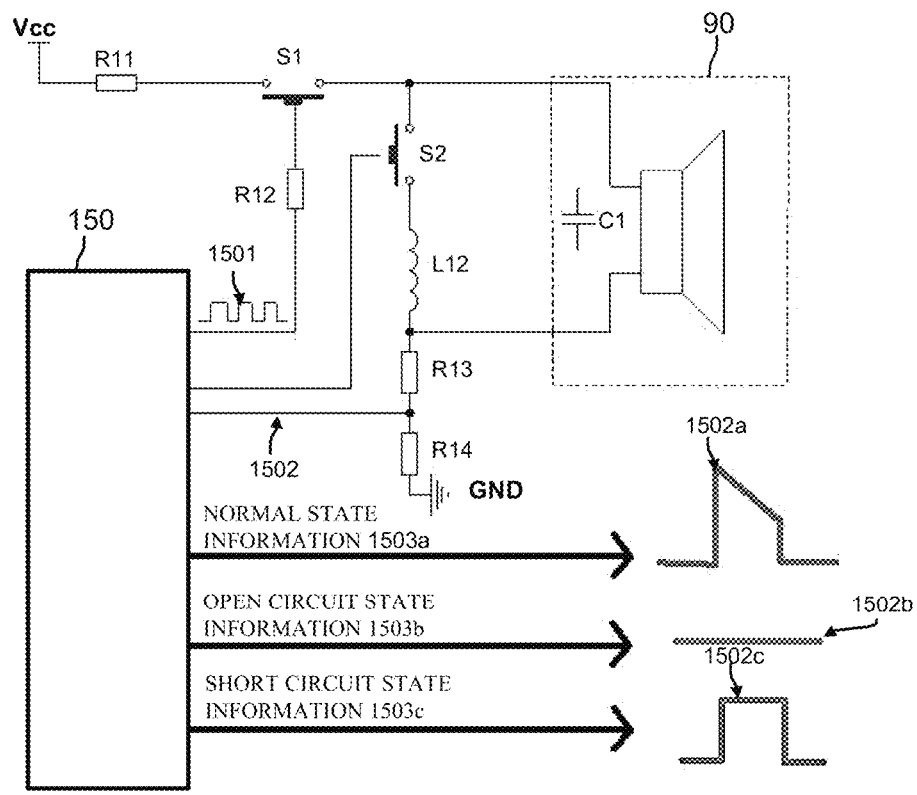
FIG. 4 is a schematic diagram of yet another exemplary circuit structure of the state detection device shown in FIG. 1.

FIG. 4 is a schematic diagram of yet another exemplary circuit structure of the state detection device shown in FIG. 1. As shown in FIG. 4, the detection circuit 130 includes a controllable switch S1, one end of the controllable switch S1 is connected to the low-voltage power supply Vcc through the circuit R11, and the other end of the controllable switch S1 is electrically connected with the second end of the alarm sounding component 90; the detection signal 1501 is biased on the controllable switch S1 to control its on and off. The sampling circuit 110 includes a controllable switch S2, an inductor L12, sampling resistors R13 and R14, wherein the inductor L12 and the controllable switch S2 are connected in series, and they are connected in parallel with the equivalent load capacitor C1, and the on and off of the controllable switch S2 is controlled by the output signal of the controller 150, so as to be able to control whether or not to perform sampling; the sampling resistors R13 and R14 are disposed in series with the inductor L12, and the sampling resistors R13 and R14 are disposed between the first end of the alarm sounding component 90 and the ground.

As shown in FIG. 4, by the exemplary detection circuit and sampling circuit therein, the sampled signals 1502a, 1502b and 1502c shown in FIG. 4 can be collected, and the normal state information 1503a, the open circuit state information 1503b and the short circuit state information 1503c outputted by the state detection device 10 are output information corresponding to the analyzed and processed sampled signals 1502a, 1502b and 1502c, respectively, which can be, for example, the second digital state information of the example above.

In an embodiment, the state detection device 10 shown in FIGS. 3 and 4 may be provided with a corresponding display component to display the digital state information of output thereby, such as the digital state information as described above.

The state detection device 10 of the above example can quickly and timely discover faults such as a short circuit or an open circuit, and the like, of the alarm sounding component 90, and can also accurately detect the fault of the alarm sounding component, and continuously monitor the state of the alarm sounding component 90 as needed, being easy to ensure the reliability of the alarm sounding component 90, particularly the reliability in a fire alarm system, for example.

FIG. 5 is a schematic diagram of the module structure of a field alarm terminal according to an embodiment of the present invention. The field alarm terminal 100 may be installed, for example, at a respective location of a building and may be controlled, for example, by remotely driving. The field alarm terminal 100 includes an alarm sounding component 90 for raising an audio alarm signal, and the state detection device 10 of any of the above embodiments; thus, the fault condition of the alarm sounding component 90 in the field alarm terminal 100 can be accurately monitored in real time.

The field alarm terminal 100 may be, for example, an acousto-optic alarm component, the specific type of which is not limiting.

Figure 6:
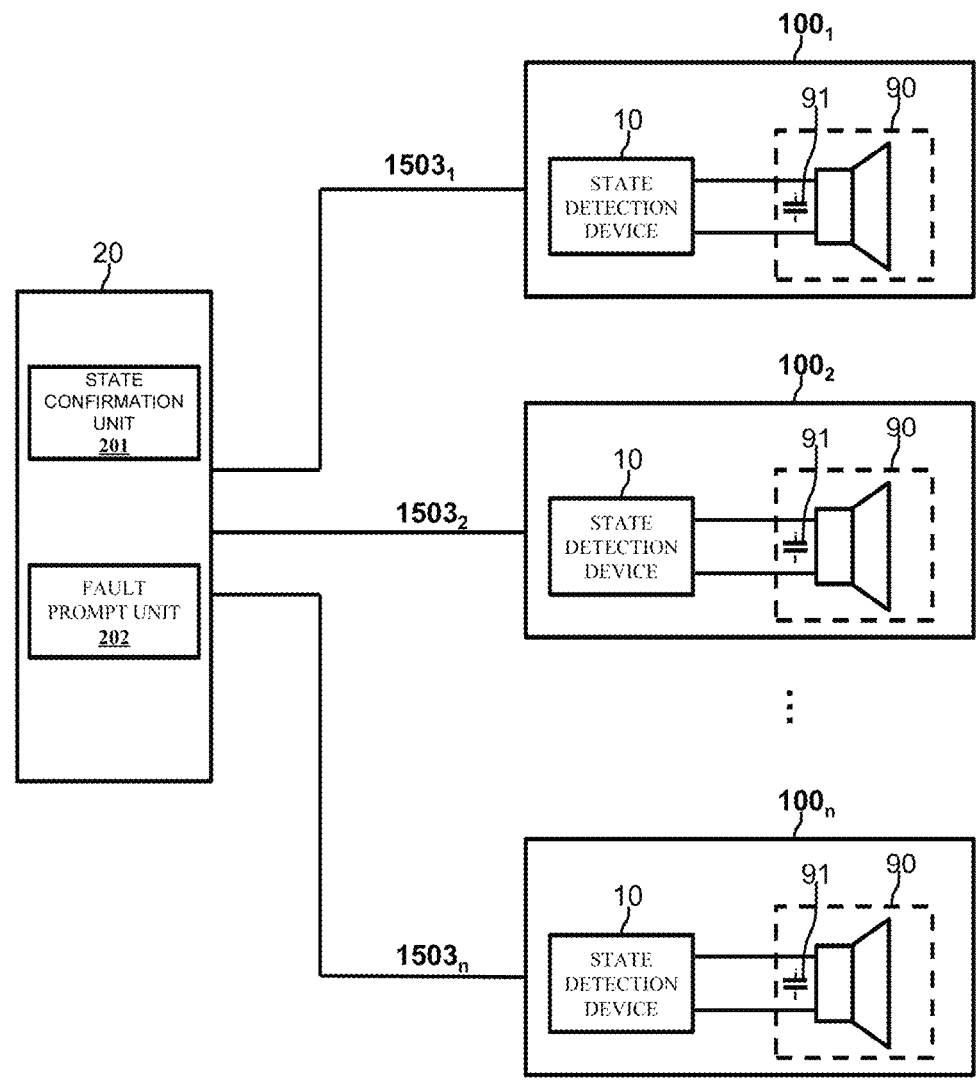
FIG. 6 is a schematic diagram of the module structure of a fire alarm system according to an embodiment of the present invention.

FIG. 6 is a schematic diagram of the module structure a fire alarm system according to an embodiment of the present invention. The fire alarm system of this embodiment includes one or more field alarm terminals 100 (e.g., field alarm terminals 1001, 1002, . . . , 100n, where n is an integer larger than or equal to 2) installed in a building, and a control module 20 that may be coupled with the field alarm terminal 100 and receive state information 1503 (e.g., the second digital state information described above) from the field alarm terminal 100. The control module 20 may specifically be implemented, for example, by a computer, a server, a portable mobile terminal, or a combination thereof.

In an embodiment, the control module 20 includes a fault prompt unit 202 for prompting a fault condition of the respective field alarm terminal 100 based on the state information 1503, for example, the fault of open circuit and short circuit of certain field alarm terminals 100 may specifically be prompted by voice, a display showing, or the like. In this way, the building manager can maintain the field alarm terminal 100 in time according to the fault promotion.

In an embodiment, the control module 20 may further include a state confirmation unit 201, wherein the confirmation unit 201 is used for confirming the fault condition of the alarm sounding component 90 of the respective field alarm terminal 100 based on the state information 1503, for example, the confirmation unit 201 provides a user input interface for manual confirmation of the fault condition, and the confirmation unit 201 also confirms a fault condition that is relatively easy to understand and that has good readability based on the second digital state information, for example.

The field alarm terminal of the fire alarm system of the above embodiment has good working reliability, and facilitates the maintenance of the field alarm terminal in time.

It should be noted that the state detection device 10 of the alarm sounding component of the above example is not limited to the field alarm terminal 100 and the fire alarm system applied to the above example, which may also be applied in other systems that have high working reliability requirements for the alarm sounding component 90.

Some block diagrams shown in the figures are functional entities and do not necessarily have to correspond to physically or logically separate entities. Certain functional entities may be implemented in software form, or certain functional entities may be implemented in one or more hardware modules or integrated circuits, or these functional entities may be implemented in different networks and/or processor devices and/or microcontroller devices.

Although some of the block diagrams are shown separately, it should be understood that some of the block diagrams may be combined, or some of the block diagrams may be implemented further separately.

The above examples mainly illustrate the state detection device of the alarm sounding component of the present invention, a field alarm terminal using the state detection device, and a fire alarm system. While only some of the embodiments of the present invention have been described, it will be appreciated by those of ordinary skill in the art that the present invention may be implemented in many other forms without departing from its spirit and scope. Accordingly, the illustrated examples and embodiments are to be considered as illustrative and not restrictive, and the invention may encompass various modifications and alternations without departing from the spirit and scope of the invention as defined by the appended claims.

What is claimed is:

1. A state detection device of an alarm sounding component, comprising:
   a detection circuit for applying a detection signal to control detection of an equivalent load capacitor of the alarm sounding component that is capacitive;
   a sampling circuit for sampling feedback information of the equivalent load capacitor of the alarm sounding component when a signal of the detection signal is applied to the alarm sounding component to obtain a sampled signal; and
   a controller for generating the detection signal and analyzing and processing the sampled signal to obtain state information which can reflect a fault condition of the alarm sounding component;
   wherein the detection signal is a pulse voltage signal;
   wherein the detection circuit comprises:

a triode, a base of the triode is biased with the pulse voltage signal to control on and off of the triode, and a collector of the triode is electrically connected with a first end of the alarm sounding component, and an emitter of the triode is grounded; and a low-voltage power supply for outputting direct current voltage to a second end of the alarm sounding component.

2. The state detection device of claim 1, wherein the sampling circuit comprises:

an inductor, two ends of the inductor are electrically connected with the first end and the second end of the alarm sounding component respectively so as to be in parallel connection with the equivalent load capacitor; and a first sampling resistor and a second sampling resistor disposed in series with the inductor;

wherein the first sampling resistor is disposed between the inductor and the low-voltage power supply, and the second sampling resistor is disposed between the inductor and the controller.

3. A state detection device of an alarm sounding component, comprising:

a detection circuit for applying a detection signal to control detection of an equivalent load capacitor of the alarm sounding component that is capacitive;

a sampling circuit for sampling feedback information of the equivalent load capacitor of the alarm sounding component when a signal of the detection signal is applied to the alarm sounding component to obtain a sampled signal; and a controller for generating the detection signal and analyzing and processing the sampled signal to obtain state information which can reflect a fault condition of the alarm sounding component;

wherein the controller comprises:

a sampled signal processing module for analyzing and processing the sampled signal to obtain state information which can reflect the fault condition of the alarm sounding component;

a detection signal generation module for generating the detection signal; and a state information output module for controlling the output of the state information;

wherein the detection signal is a pulse voltage signal; the sampled signal processing module is further used for calculating a voltage mean value of the sampled signal during a time period correspondingly including an occurrence of a falling edge of the pulse voltage signal, and performing analog-to-digital conversion on the voltage mean value to obtain first digital state information.

4. The state detection device of claim 3, wherein the state information output module is further used to amplify and convert the first digital state information into second digital state information section by section.

5. The state detection device of claim 3, wherein the state information comprises:

normal state information reflecting that the alarm sounding component works normally, open circuit state information reflecting that the alarm sounding component is open circuited, and short circuit state information reflecting that the alarm sounding component is short circuited.

6. The state detection device of claim 3, wherein the sampled signal sampled by the sampling circuit corresponds to a voltage measured during an edge of the pulse voltage signal.

7. The state detection device of claim 3, wherein the alarm sounding component is used for a field alarm terminal of a fire alarm system.

8. The state detection device according to claim 3, wherein the alarm sounding component is a piezoelectric buzzer.

9. The state detection device of claim 3, wherein a frequency of the pulse voltage signal is in a range of an order of 10 KHz to 1 MHz.

10. A field alarm terminal comprising an alarm sounding component for raising an audio alarm signal, further comprising a state detection device of claim 3.

11. A fire alarm system, comprising:

one or more field alarm terminals of claim 10; and a control module coupled with the field alarm terminal and receiving state information from the field alarm terminal.

12. The fire alarm system of claim 10, wherein the control module comprises: a fault prompt unit for prompting a fault condition of respective field alarm terminal based on the state information.

13. The fire alarm system of claim 10, wherein the control module comprises: state confirmation module for confirming the fault condition of the alarm sounding component of the respective field alarm terminal based on the state information.

* * * * *